United States Patent
Kasahara et al.

(10) Patent No.: US 9,278,768 B2
(45) Date of Patent: Mar. 8, 2016

(54) PROCESS LIQUID CHANGING METHOD AND SUBSTRATE PROCESSING APPARATUS

(71) Applicant: Tokyo Electron Limited, Tokyo (JP)

(72) Inventors: Masatoshi Kasahara, Koshi (JP); Shinichiro Shimomura, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 179 days.

(21) Appl. No.: 13/774,091

(22) Filed: Feb. 22, 2013

(65) Prior Publication Data

US 2013/0220478 A1 Aug. 29, 2013

(30) Foreign Application Priority Data

Feb. 24, 2012 (JP) ................. 2012-038597

(51) Int. Cl.
*H01L 21/304* (2006.01)
*B65B 3/04* (2006.01)
*H01L 21/67* (2006.01)

(52) U.S. Cl.
CPC ............ *B65B 3/04* (2013.01); *H01L 21/67017* (2013.01)

(58) Field of Classification Search
CPC ....................................................... B65B 3/04
See application file for complete search history.

(56) References Cited

U.S. PATENT DOCUMENTS 7,000,416 B2 * 2/2006 Hirooka et al. ............... 62/259.2

FOREIGN PATENT DOCUMENTS

| JP | 2006-269743 | * | 10/2006 | ............ H01L 21/304 |
| JP | 2006-269743 A1 | | 10/2006 | |
| JP | 2007-317927 A1 | | 12/2007 | |
| JP | 2007-329328 A1 | | 12/2007 | |
| JP | 2012-009705 A | * | 1/2012 | ............ H01L 21/304 |

OTHER PUBLICATIONS

English Machine Translatin of JP2006-269743.*
English Machine Translation of JP2012-009705A.*
Japanese Office Action (Application No. 2012-038597) dated Apr. 1, 2014.

* cited by examiner

*Primary Examiner* — Michael Barr
*Assistant Examiner* — Jason Riggleman
(74) *Attorney, Agent, or Firm* — Burr & Brown, PLLC

(57) ABSTRACT

A process liquid changing method is provided for changing process liquids in a substrate processing apparatus including storage tank, a circulation line with a circulation pump, and a process liquid supply nozzle connected to the circulation line through a branch line. The method includes: discharging the process liquid in the storage tank; discharging a process liquid remaining in the circulation line from a drain connected to the circulation line at a second position of the circulation line, while supplying a purge gas to the circulation line at a first position of the circulation line, wherein the first position is located upstream of a junction area where the branch line is connected to the circulation line, and the second position is located downstream of the junction area and upstream of the storage tank; and supplying a process liquid into the storage tank.

4 Claims, 2 Drawing Sheets

PROCESS LIQUID CHANGING METHOD AND SUBSTRATE PROCESSING APPARATUS

CROSS REFERENCE TO RELATED APPLICATION

This application is based on and claims the benefit of priority from Japanese Patent Application No. 2012-038597 filed on Feb. 24, 2012, the entire contents of which are incorporated herein by reference.

TECHNICAL FIELD

The embodiments disclosed herein relate to a technique for changing process liquids in a substrate processing apparatus.

BACKGROUND ART

In manufacturing of semiconductor devices, a cleaning process with the use of a chemical liquid is performed in order to remove unnecessary films or contaminants on a substrate such as a semiconductor wafer. A substrate processing apparatus for performing such a cleaning process is provided with a process liquid circulation system for supplying a process liquid to liquid processing units incorporated in the substrate processing apparatus (See JP2007-329328A, for example.).

The process liquid circulation system provided in the substrate processing apparatus of JP2007-329328A includes a process liquid storage tank and a circulation line (pipeline) connected to the process liquid storage tank. The circulation line has a pump, by which a process liquid is fed out from the process liquid storage tank and is returned to the process liquid storage tank. Liquid processing units are connected in parallel to the circulation line through respective branch lines. In accordance with process schedules of the respective liquid processing units, the process liquid is supplied to each liquid processing unit through each branch line, and each liquid processing unit performs a predetermined liquid process to a substrate by using the process liquid. When the process liquid in the process liquid supply system deteriorates, the deteriorated process liquid is changed or replaced with a new process liquid of the same kind. When a different process using a process liquid of different kind or different concentration is performed in the substrate processing apparatus, the process liquid in the process liquid supply system is changed or replaced with the process liquid of the different kind or the different concentration.

A conventional process liquid changing method is carried out by (1) discharging an old process liquid from a process liquid storage tank, (2) feeding a new process liquid to the process liquid storage tank, (3) causing the new process liquid in the process liquid storage tank to circulate in a process liquid circulation line for a predetermined period of time, so as to expel the old process liquid in the process liquid circulation line therefrom, (4) discharging the process liquid from the process liquid storage tank, and (5) repeating steps (2) to (4) plural times. Since it is difficult to completely remove the liquid existing in the process liquid circulation system (in particular, in a piping), a certain amount of liquid inevitably remains in the process liquid circulation system. If the amount of liquid remaining in the process liquid circulation system is large, the aforementioned steps (2) to (4) should be performed many times, resulting in wasteful consumption of the process liquid.

SUMMARY OF THE INVENTION

The embodiments disclosed herein provide a technique for reducing an amount of consumption of a process liquid when changing it in a substrate processing apparatus.

In one embodiment, there is provided a process liquid changing method for changing process liquids in a substrate processing apparatus, said apparatus including a storage tank configured to store a process liquid, a circulation line having ends thereof connected to the storage tank, a circulation pump provided on the circulation line, and a process liquid supply nozzle connected to the circulation line through a branch line, said process liquid changing method comprising: discharging the process liquid in the storage tank; discharging a process liquid remaining in the circulation line from a drain part connected to the circulation line at a second position of the circulation line, while supplying a purge gas to the circulation line at a first position of the circulation line, wherein the first position is located upstream of a junction area where the branch line is connected to the circulation line, and the second position is located downstream of the junction area and upstream of the storage tank: and supplying a process liquid into the storage tank.

In another embodiment, there is provided a substrate processing apparatus comprising: a storage tank configured to store a process liquid; a circulation line having ends thereof connected to the storage tank; a circulation pump provided on the circulation line; a process liquid supply nozzle connected to the circulation line through a branch line; a pure gas supply unit configured to supply a purge gas to the circulation line at a first position of the circulation line, the first position being located upstream of a junction area where the branch line is connected to the circulation line; a drain unit connected to the circulation line at a second position of the circulation line, the second position being located downstream of the junction area and upstream of the storage tank.

According to the above embodiments, since a purge gas is supplied to the circulation line, a large part of the process liquid remaining in the circulation line after the normal liquid discharge can be forcibly discharged efficiently. Thus, an amount of process liquid to be used for cleaning the circulation line and thus the circulation system can be reduced.

DETAILED DESCRIPTION OF THE INVENTION

Figure 1:
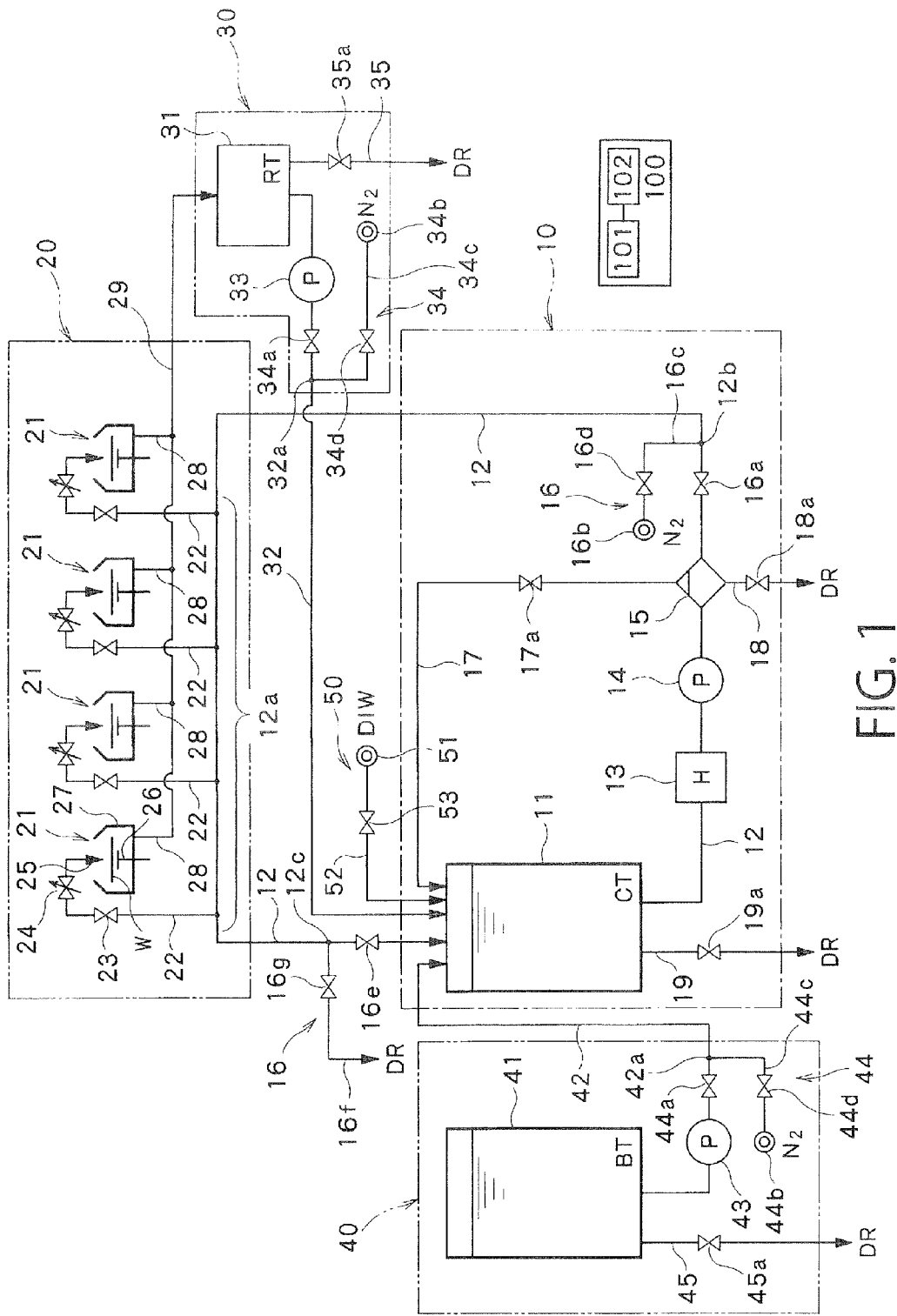
FIG. 1 is a system diagram showing an overall structure of a substrate processing apparatus in one embodiment.

Preferred embodiments will be described with reference to the attached drawings. As shown in FIG. 1, a substrate processing apparatus includes: a process liquid circulation system 10; a process block 20 in which substrates to be processed (hereinafter referred to simply as "substrate(s) W"), such as a semiconductor wafer, are processed by using a process liquid circulating in the process liquid circulation system 10; a process liquid recovery system 30 that returns a process liquid discharged from the process block 20 to the process liquid circulation system 10 for re-use; and a process liquid replenishment system 40 that supplies a process liquid for change or replenishment to the process liquid circulation system 10.

First, the process liquid circulation system 10 is described. The process liquid circulation system 10 includes a storage tank 11 that stores a process liquid, and a circulation line (circulation pipeline) 12 connected to the circulation tank 11. Provided on the circulation line 12 are: a heater 13 that heats the process liquid (the heater 13 may be omitted depending on a kind of process liquid), a circulation pump 14 that feeds a process liquid, and a filter 15 that removes contaminants, such as particles, contained in the process liquid, which are arranged in that order along the liquid flowing direction starting from the storage tank 11. The circulation line 12 is provided with a circulation line purging mechanism 16 that supplies a purge gas to the circulation line 12. The circulation line purging mechanism 16 includes: an on-off valve 16*a* provided on the circulation line 12 on the downstream side of the filter 15; an nitrogen gas supply source 16*b* as a purge gas supply source; a purge gas supply line 16*c* connected to the circulation line 12 at a first position 12*b* on the downstream side of the on-off valve 16*a*, and an on-off valve 16*d* provided on the purge gas supply line 16*c*. Further, the circulation line purging mechanism 16 includes: an on-off valve 16*e* provided on the circulation line 12 at a position, which is on the downstream side of the storage tank 11 but at which the circulation line 12 almost returns to the storage tank 11; a drain line 16*f* connected to the circulation line 12 at a second position 12*c* on the upstream side of the on-off valve 16*e*, and an on-off valve 16*g* provided on the drain line 16*f*.

A gas vent line 17 is connected to the filter 15 to remove bubbles contained in the process liquid flowing through the circulation line 12. The gas vent line 17 is connected to the storage tank 11. The gas vent line 17 is provided thereon with an on-off valve 17*a*. Also connected to the filter 15 is a drain line 18, which is provided thereon with an on-off valve 18*a*. Connected to the storage tank 11 is a drain line 19, which is provided with an on-off valve 19*a*.

Next, the process block 20 and the process liquid recovery system 30 are described. The process block 20 includes a plurality of processing units 21 having essentially the same structure. A part of the circulation line 12 of the process liquid circulation system 10 passes through the process block 20. In a junction area 12*a* of the circulation line 12, which resides inside the process block 20, branch lines 22 through which the process liquid is supplied to the respective processing units 21 are connected to the circulation line 12. The junction area 12*a* is located on the downstream side of the first position 12*b* to which the purge gas supply line 16*c* of the circulation line purging mechanism 16 is connected, and the junction area 12*a* is located on the upstream side of the second position 12*c* to which the drain line 16*f* of the circulation line purging mechanism 16 is connected. Each branch line 22 is provided with an on-off valve 23 and a flow control valve 24. The branch line 22 is connected to a process liquid supply nozzle 25. The process liquid is supplied, at a controlled flow rate, from the process liquid supply nozzle 25 to a substrate W held by a substrate holding unit 26, whereby the substrate W is subjected to a predetermined liquid process such as a cleaning process or a wet etching process. Although FIG. 1 shows the four processing units 21, the number of processing units 21 disposed in the process block 20 is optional.

Connected to each processing unit 21 is a branch recovery line 28, which recovers the process liquid discharged from the process liquid supply nozzle 25 via a cup 27, which is disposed around the substrate holding unit 26 to prevent scattering of the process liquid. The respective branch recovery lines 28 are connected to a recovery line 29, and the recovery line 29 is connected to a recovery tank 31 of the process liquid recovery system 30. Connected to the recovery tank 31 is a return line 32, and the return line 32 is connected to the storage tank 11. The return line 32 is provided thereon with a return pump 33. The return pump 33 returns the process liquid collected in the recovery tank 31 to the storage tank 11. In addition, on the downstream side of the return pump 33, there is provided a return line purging mechanism 34 that supplies nitrogen gas to the return line 32. The return line purging mechanism 34 includes: an on-off valve 34*a* provided on the return line 32 on the downstream side of the return pump 33; an nitrogen gas supply source 34*b* as a purge gas supply source; a purge gas supply line 34*c* connected to the return line 32 at a position 32*a* on the downstream side of the on-off valve 34*a*; and an on-off valve 34*d* provided on the purge-gas supply line 34*c*. A drain line 35 provided thereon with an on-off valve 35*a* is connected to the recovery tank 31.

Next, the process liquid replenishment system 40 is described. The process liquid replenishment system 40 includes a replenishment tank 41 for supplying a process liquid to the storage tank 11 of the process liquid circulation system 10. Connected to the replenishment tank 41 is a replenishment line 42, which is connected to the storage tank 11. The replenishment line 42 is provided thereon with a replenishment pump 43. The replenishment pump 43 supplies the process liquid stored in the replenishment tank 41 to the storage tank 11. Further, on the downstream side of the replenishment pump 43, there is provided a replenishment line purging mechanism 44 for supplying a gas to the replenishment line 42. The replenishment line purging mechanism 44 includes: an on-off valve 44*a* provided on the replenishment line 42 on the downstream side of the replenishment pump 43, an nitrogen gas supply source 44*b* as a purge gas supply source; a purge gas supply line 44*c* connected to the replenishment line 42 at a position 42*a* on the downstream side of the on-off valve 44*a*; and an on-off valve 44*d* provided on the purge gas supply line 44*c*. A drain line 45 provided thereon with an on-off valve 45*a* is connected to the replenishment line 41. Although not shown, the replenishment tank 41 is provided with a replenishment line for supplying the replenishment tank 41 with a process liquid.

The substrate processing apparatus further includes a DIW supply unit 50 configured to supply DIW as a cleaning liquid for cleaning the process liquid circulation system 10. The DIW supply unit 50 has: a DIW supply source 51; a DIW supply line 52 connecting the DIW supply source 51 and the storage tank 11 of the process liquid circulation system 10; and an on-off valve 53 provided on the DIW supply line 52.

For a certain kind of substrate processing apparatus that processes a substrate using plural kinds of process liquids, a plurality of process liquid supply nozzles 25 are disposed in each processing unit 21 in the process block 20, and a plurality of the process liquid circulation systems 10, a plurality of the process liquid recovery systems 30, and a plurality of the process liquid replenishment systems 40 are disposed according to need. A process liquid of a certain kind cannot be returned to the storage tank 11. In this case, the recovery line 29 is provided as drain line which is directly connected to a factory drainage system; and the recovery tank 31, the return pump 33 and the return line purging mechanism 34 are not provided. A purge gas is not limited to nitrogen gas. Any gas can be used as long as the gas will not react with a process liquid and will not contaminate an area where the process liquid flows.

The substrate processing apparatus includes a control unit that controls the whole operations of the substrate processing apparatus. The control unit 100 controls operations of the respective functional components (the substrate holding unit of the processing unit, the respective on-off valves, the flow-rate regulating valves, the pumps and so on) of the substrate processing apparatus. The control unit 100 can be realized by, e.g., a general purpose computer as a hardware, and a program (an apparatus control program and process recipes) for operating the computer as a software. The software is stored in a storage medium, such as a HDD or the like, which is fixedly disposed on the computer, or stored in a storage medium, such as a CD-ROM, a DVD, a flash memory or the like, which is removably set in the computer. Such a storage medium is indicated by a reference sign 101. Based on instructions from a user interface, not shown, a processor 102 calls a predetermined process recipe from the storage medium 101 and executes the same, whereby the respective functional components of the substrate processing apparatus are operated under the control of the control unit 100, so as to perform a predetermined process. The storage medium 101 stores a program for performing the below-described procedure for changing process liquids.

Next, the operation of the substrate processing apparatus is described.

In usual operation of the substrate processing apparatus, a process liquid is circulated in the circulation line 12 by the circulation pump 14, with the on-off valves 16a and 16e being opened. During the circulation of the process liquid, the on-off valves 19a, 16d, 16g, 17a and 18a are closed. The heater 13 heats the process liquid to a suitable temperature according to need. Contaminants such as particles contained in the process liquid are removed by the filter 15. The process liquid is fed into each processing unit 21 from the circulation line 12 through the branch line 22 on demand, so that a substrate W is processed with the process liquid. The liquid process of the substrate W is performed under the control of the control unit 100. In addition, in usual operation, the process liquid recovery system 30 returns, when needed, a used process liquid, which has been collected into the recovery tank 31 through the recovery line 29, to the storage tank 11. In order to perform such usual operation, the control unit 100 controls the respective functional components of the substrate processing apparatus based on the process recipe stored in the storage medium 101.

Figure 2:
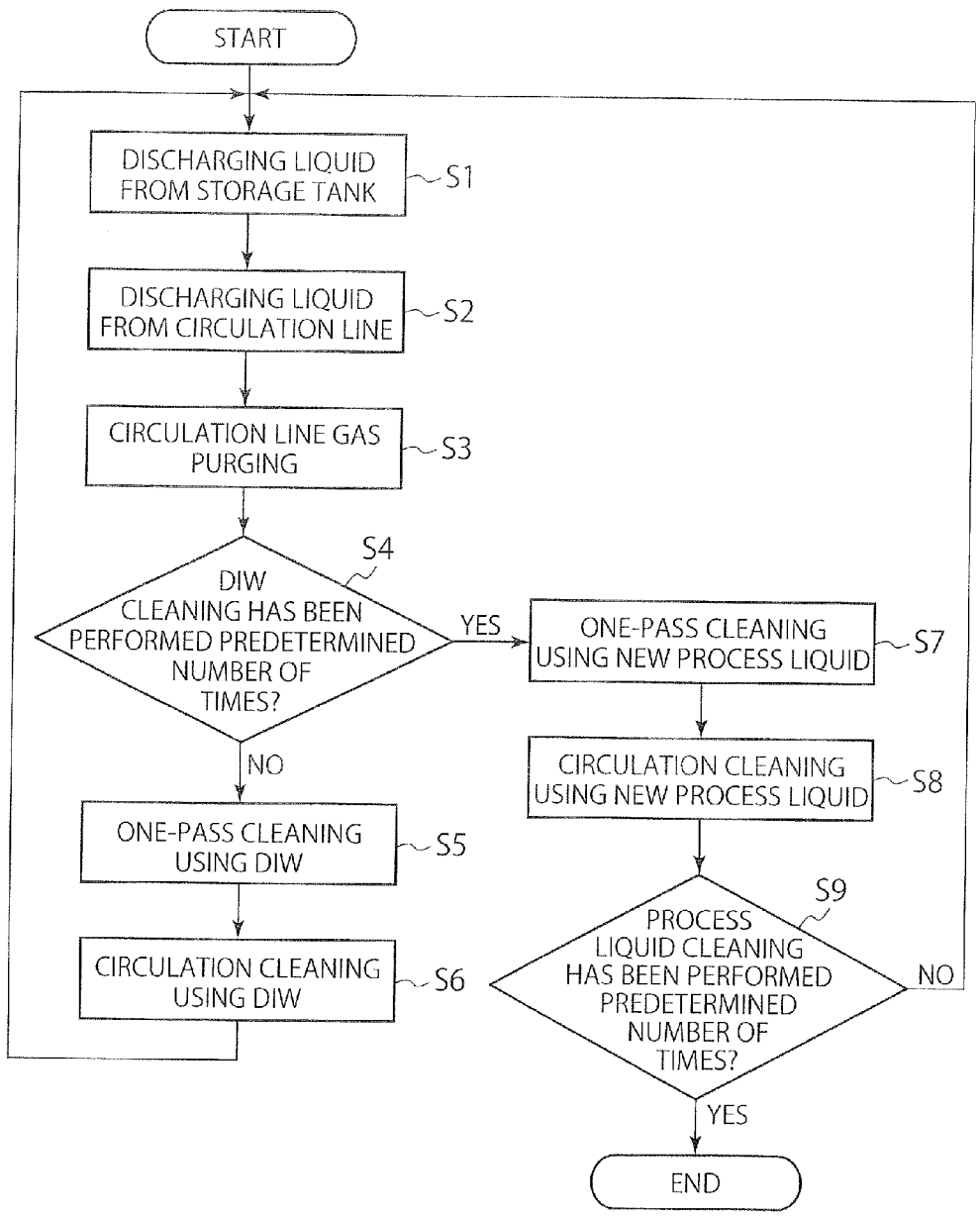
FIG. 2 is a flowchart showing a sequence for changing process liquids.

Next, a procedure for changing process liquids is described with reference also to a flowchart shown in FIG. 2.

An operator previously sets, through the not-shown user interface, various parameters relating to a process liquid change operation, such as the number of times of a DIW cleaning process (described in detail below), the number of times of a "process liquid cleaning process" (described in detail below) and so on. In this specification, the wording "process liquid cleaning process" refers to a process that washes, rinses or flushes liquid-contacting surfaces of a system (e.g., inner surfaces of tanks, pipelines, valves and so on) with a process liquid, which is the same as a process liquid to be used next in the system. Set values of those parameters are stored in the storage medium 101. In order to perform the process liquid change operation, the control unit 100 controls the respective functional components of the substrate processing apparatus, based on the aforementioned set values and the process liquid change procedure stored in the storage medium 101. In a case where an old process liquid (currently used process liquid) is changed to a new process liquid of the same specification (of the same kind and the same concentration), the change timing of the process liquids can be determined, based on the total used hours of the currently used process liquid and/or the total number of substrates having been processed by the currently used process liquid. Alternatively, the change timing can be determined based on a value detected by a sensor (not shown) for detecting a parameter (the number of particles, a pH value, etc.) indicative of deterioration degree of the currently used process liquid. A reference value based on which the change timing is determined can be specified by the operator through the not-shown user interface. In another case, the currently used process liquid may be changed to a process liquid of a different specification (of a different kind or a different concentration). In both cases, when the control unit 100 recognizes a process liquid change request, a series of process liquid change procedure shown in FIG. 2 is automatically performed under the control of the control unit 100.

When the process liquid change procedure is performed, loading of a substrate W into the processing units 21 is stopped. After processing of a substrate W has been finished in all the processing units 21 and unloading of the substrates W therefrom has been terminated, the flow shown in FIG. 2 is started. Firstly, the on-off valve 19a of the drain line 19 is opened so as to discharge the liquid in the storage tank 11 (step S1). Then, the circulation pump 14 is operated with the on-off valve 19a being opened, so that the liquid in a zone, from the storage tank 11 to the circulation pump 14, of the circulation line 12 is driven off to the downstream side of the circulation pump 14 (step S2). The step S2 is performed by continuously operating the circulation pump 14 until the circulation line 12 on the upstream side of the circulation pump 14 becomes empty so that the circulation pump 14 does not pump the liquid any more (idle-running condition). The steps S1 and S2 may be performed in another way. For example, the on-off valves 16d, 16e and 19a are closed while the on-off valves 16a and 16g are opened, and the circulation pump 14 is operated. Thus, the liquid in the storage tank 11 passes through the circulation line 12 so as to be discharged from the drain line 16f. After the storage tank 11 has become empty, the circulation pump 14 is operated for a while until the circulation pump 14 is brought into idle-running condition, discharging no liquid. In this manner, the same state as the state immediately after the step S2 can be achieved. The steps S1 and S2 are also referred to as "process liquid discharging process".

Immediately after the step S2, the liquid remains in a zone of the circulation line 12 extending from the circulation pump 14 to the storage tank 11 in the liquid flowing direction. In order to discharge the liquid in this zone, the supplying of nitrogen gas (liquid discharging process) is performed. At first, the on-off valve 16a and the on-off valve 16e, which are provided on the circulation line 12, are closed, and the on-off valve 16d, which is provided on the purge gas supply line 16c, and the on-off valve 16g, which is provided on the drain line 16f, are opened. Thus, nitrogen gas flows from the nitrogen gas supply source 16b into the circulation line 12 through the purge gas supply line 16c, and further flows through the circulation line 12 so as to be discharged from the drain line 16f. Together with the flow of the nitrogen gas, the liquid in a zone, extending from the first position 12b to the second position 12c, of the circulation line 12, is forcibly discharged from the drain line 16f (step S3). Shortly before the step S3 is finished (for example, during a time period from five seconds before the finish timing to the finish timing), the on-off valve 16e, in addition to the on-off valve 16g, is opened. Thus, the liquid in a zone, extending from the second position 12c to the storage tank 11, of the circulation line 12 can be drained. When the on-off valve 16e is opened too early, the old process liquid in the circulation line 12 on the upstream side of the second position 12c disadvantageously flows into the storage tank 11 to contaminate the storage tank 11. On the other hand, shortly before the step S3 is finished, almost all the old process liquid in the circulation line 12 on the upstream side of the second position 12c is discharged from the drain line 16f. Thus, if the on-off valve 16e is opened at this timing, flowing into the storage tank 11 is substantially only the old process liquid on the downstream side of the second position 12c.

Following thereto, it is judged whether or not the DIW cleaning process (which includes the below-described steps S5 and S6) is performed a predetermined number of times (step S4). When it is judged that the DIW cleaning process has been not yet performed a predetermined number of times (NO in step S4), the flow proceeds to the step S5 and the DIW cleaning process is performed. Firstly, the on-off valve 16a on the circulation line 12 and the on-off valve 16g on the drain line 16f are opened, and the on-off valve 16e on the circulation line 12, the on-off valve 16d on the purge-gas supply line 16c and the on-off valve 19a on the drain line 19 are closed. In this state, the on-off valve 53 provided on the DIW supply line 52 is opened, so that a predetermined amount of DIW (deionized water) is supplied and stored in the storage tank 11 (the maximum water level in the storage tank is not necessary.). Then, while the supply of DIW from the DIW supply line 52 to the storage tank 11 is continued, the circulation pump 14 is operated, so that the DIW stored in the storage tank 11 flows through the circulation line 12 so as to be discharged from the drain line 16f. At this time, a zone, extending from the storage tank 11 to the second position 12c, of the circulation line 12 and the devices (the heater 13, the pump 14, the filter 15 and so on) provided in this zone are cleaned (rinsed) with the DIW (step S5). The operation in the step 5 for cleaning the circulation line 12 and the devices in the foregoing manner is referred to as "one-pass cleaning". The step S5 is performed for a predetermined period of time. After that, while the operation of the circulation pump 14 and the supply of DIW from the DIW supply line 52 to the storage tank 11 are continued, the on-off valve 16g on the drain line 16f is closed, and the on-off valve 16e on the circulation line 12 is opened. Thus, the storage tank 11 is filled with the DIW, and the DIW is circulated in the circulation line 12 for a predetermined period of time. At the timing when the storage tank 11 is filled with the DIW (i.e., the water level in the storage tank is maximum), the supply of DIW from the DIW supply lie 52 to the storage tank 11 is stopped. Thus, the whole area of the circulation line 12 starting from the storage tank 11 and returning to the storage tank 11 and the devices provided in the whole area of the circulation line 12 are further cleaned (rinsed) with the DIW (step S6).

After the step S6 has been performed for a predetermined period of time, the circulation pump 14 is stopped. Then, the flow returns to the step S1, and the liquid (DIW, at this time) in the storage tank 11 is discharged (step S1). Thereafter, the liquid (DIW, at this time) in the circulation line 12 is discharged (step S2). After that, the step S3 is performed so that the DIW remaining in the circulation line 12 on the downstream side of the first position 12b is discharged.

Following thereto, the flow again proceeds to the step S4, and it is again judged whether or not the DIW cleaning process (S5 and S6) has been performed predetermined number of times. When it is judged that the DIW cleaning process has been not yet performed predetermined number of times (NO in step S4), the steps S5, S6, S1, S2 and S3 are performed again. Herein, on the assumption that "the predetermined number of times" is "three times" and that the DIW cleaning process has been performed three times (i.e., the steps S5 and S6 are respectively performed three times) (YES in step S4), the flow proceeds to step S7.

At first, the on-off valve 16a on the circulation line 12 and the on-off valve 16g on the drain line 16f are opened, and the on-off valve 16e on the circulation line 12, the on-off valve 16d on the purge gas supply line 16c and the on-off valve 19a on the drain line 19 are closed. In this state, a new process liquid is supplied by the process liquid replenishment system 40 to the storage tank 11. In detail, while the on-off valve 44d provided on the purge gas supply line 44c is closed, the on-off valve 44a provided on the replenishment line 42 is opened and the replenish pump 43 is operated. Thus, a new process liquid stored in the replenishment tank 41 is supplied to the storage tank 11, so that a predetermined amount of new process liquid is stored in the storage tank 11 (the maximum liquid level in the storage tank is not necessary). Then, while the supply of the new process liquid from the replenishment line 42 to the storage tank 11 is continued, the circulation pump 14 is operated, so that the new process liquid in the storage tank 11 flows through the circulation line 12 so as to be discharged from the drain line 16f. At this time, the zone, extending from the storage tank 11 to the second position 12c, of the circulation line 12, and the devices (the heater 13, the pump 14, the filter 15 and so on) provided in this zone are cleaned (rinsed) with the new process liquid (step S7). The operation in the step 7 for cleaning the circulation line 12 and the devices in the foregoing manner is referred to as "one-pass cleaning". The step S7 is performed for a predetermined period of time. After that, while the operation of the circulation pump 14 and the supply of new process liquid from the replenishment line 42 to the storage tank 11 are continued, the on-off valve 16g on the drain line 16f is closed and the on-off valve 16e on the circulation line 12 is opened. Thus, the storage tank 11 filed with the new process liquid (i.e., the liquid level in the storage tank is maximum), and the process liquid is circulated in the circulation line 12 for a predetermined period of time. At the timing when the liquid level in the storage tank 11 becomes maximum, the supply of process liquid from the replenishment line 42 to the storage tank 11 is stopped. Thus, the whole area of the circulation line 12 starting from the storage tank 11 and returning to the storage tank 11 and the devices provided in the whole area of the circulation line 12 are further cleaned (rinsed) with the new process liquid (step S8).

After the step S8 has been performed for a predetermined period of time, the circulation pump 14 is stopped. Then, it is judged whether or not the process of rinsing the system with the new process liquid to be used next (i.e., the steps S7 and S8, hereinafter referred to as "process liquid cleaning process") has been performed predetermined number of times (e.g., twice) or not (step S9). When it is judged that the process liquid cleaning process has been not yet performed predetermined number of times (NO in step S9), the steps S1, S2, S3, (S4), S7 and S8 are performed again. When it is judged that the process liquid cleaning process has been already performed predetermined number of times (YES in step S9), the series of process liquid change operations are completed.

Since the old process liquid exists in the gas vent line 17, it is preferable that the on-off valve 17a is opened so that the gas vent line 17 is cleaned with the DIW in at least one of the step S5 and the step S6. It is preferable that the gas vent is completed at the time when the process liquid change operation is completed, i.e., when the processing unit 21 starts a process using a new process liquid. Thus, the on-off valve 17a is preferably opened at least in the last execution of the step 8.

In the aforementioned description of the embodiment, an operation of the return line purging mechanism 34 is not described. Since the old process liquid remains in the return line 32, it is also preferable to remove the old process liquid from the return line 32 as much as possible. The removal of such old process liquid may be performed before the step S1 is started, for example. To be specific, the on-off valve 35a on the drain line 35 is opened at first, so as to discharge the old process liquid stored in the recovery tank 31. Then, the on-off valve 34d on the purge-gas supply line 34c is closed and the on-off valve 34a on the return line 32 is opened. In this state, the return pump 33 is operated until the return pump 33 is brought into idle-running condition discharging no liquid, so that the old process liquid remaining in a zone, extending from the recovery tank 31 to the return pump 33, of the return line 32 is fed to the storage tank 11. Thereafter, the on-off valve 34a on the return line 32 is closed and the on-off valve 34d on the purge gas supply line 34c is opened, so that nitrogen gas flows from the nitrogen gas supply source 34b into the return line 32. Thus, the old process liquid remaining in the return line 32 on the downstream side of the position 32a flows, together with the nitrogen gas, into the storage tank 11 (liquid discharging by nitrogen gas).

During the DIW cleaning process (steps S5 and S6, in particular, step S6) or during the process liquid cleaning process (steps S7 and S8, in particular, step S8), the on-off valve 23 provided on each branch line 22 may be opened to cause the liquid circulating in the circulation line 12 to flow into each processing unit 22 through each branch line 22, so that the liquid flows into the recovery tank 31 through each branch recovery line 28 and the recovery line 29, and the liquid collected in the recovery tank 31 may be returned to the storage tank 11 by the return pump 33 through the return line 32. In addition, thereafter, nitrogen gas may be supplied to the return line 32 in accordance with the aforementioned procedure by using the return line purging mechanism 34, so as to discharge the liquid from the return line 32.

In the aforementioned description of the embodiment, the operation of the replenishment line purging mechanism 44 is not described. Since the old process liquid remains in the replenishment line 42, it is also preferable to remove the old process liquid from the replenishment line 42 as much as possible. The removal of such old process liquid may be performed before the step S2 is performed, for example. To be specific, the on-off valve 45a on the drain line 45 is opened at first, so as to discharge the old process liquid stored in the replenishment tank 41. Then, the on-off valve 44a on the replenishment line 42 is closed and the on-off valve 44d on the purge-gas supply line 44c is opened, so as to cause nitrogen gas to flow from the nitrogen gas supply source 44b into the replenishment line 42. Thus, the old process liquid remaining in the replenishment line 42 flows, together with the nitrogen gas, into the storage tank 11 (liquid discharging by nitrogen gas).

In the foregoing embodiment, a large part of the liquid remaining in the circulation line 12 can be forcibly discharged efficiently by supplying a purge gas (nitrogen gas) to the circulation line 12, after the liquid discharge through the drain line 19 and the usual liquid discharge by using the circulation pump 14. Thus, an amount of new process liquid to be used in the process liquid cleaning process (steps S7 and S8) can be reduced.

In addition, since the DIW cleaning process (steps S5 and S6) is performed after the old process liquid has been discharged (i.e., after the steps S1 to S3), the old process liquid remaining in the process liquid circulation system 10 can be surely removed by using inexpensive DIW (deionized water), whereby the inside of the process liquid circulation system 10 can be made cleaner before the process liquid cleaning process (steps S7 and S8) is started. Thus, an amount of new process liquid to be used in the process liquid cleaning process (steps S7 and S8) can be further reduced.

In the foregoing embodiment, the DIW cleaning process (steps S5 and S6) is performed plural times and the process liquid cleaning process (steps S7 and S8) is performed plural times. However, not limited thereto, the DIW cleaning process (steps S5 and S6) may be omitted, for example. Also in this case, an amount of new process liquid to be used in the process liquid cleaning process (steps S7 and S8) can be reduced, because the old process liquid can be efficiently discharged by the purge gas. The DIW cleaning process (steps S5 and S6) may be performed only once. The process liquid cleaning process (steps S7 and S8) may also be performed only once.

The invention claimed is:

1. A substrate processing apparatus comprising:
a storage tank configured to store a process liquid;
a circulation line having ends thereof connected to the storage tank;
a circulation pump provided on the circulation line;
a process liquid supply nozzle connected to the circulation line through a branch line; and
a circulation line purging mechanism that removes the process liquid existing in a zone of the circulation line on demand, the zone extending from a first position to a second position and including a junction area where the branch line is connected to the circulation line between the first and second positions;
wherein the circulation line purging mechanism includes:
a purge gas supply unit that supplies a purge gas to the circulation line from the first position of the circulation line to drive the process liquid existing in the zone of the circulation line downstream;
a drain unit having a drain line connected to the second position of the circulation line, the drain line having a first on-off valve to allow the process liquid, which is being driven downstream through the zone of the circulation line by the purge gas supplied by the purge gas supply unit, to be drained from the circulation line through the drain line,
the drain unit further comprising a second on-off valve to prevent process liquid from being driven from the second position into the storage tank by the purge gas.

2. The substrate processing apparatus according to claim 1, wherein the first position is located downstream of the circulation pump, and a third on-off valve is provided between the first position and the circulation pump.

3. The substrate processing apparatus according to claim 2, further comprising a drain part having a fourth on-off valve which is connected to a filter provided on the circulation line between the circulation pump and the third on-off valve to drain the process liquid from the filter.

4. The substrate processing apparatus according to claim 1, wherein the storage tank is provided with a drain unit configured to discharge a liquid existing in the storage tank.

* * * * *